United States Patent [19]
Sellers

[11] Patent Number: 5,810,982
[45] Date of Patent: *Sep. 22, 1998

[54] PREFERENTIAL SPUTTERING OF INSULATORS FROM CONDUCTIVE TARGETS

[75] Inventor: Jeff C. Sellers, Palmyra, N.Y.

[73] Assignee: ENI Technologies, Inc., Rochester, N.Y.

[ * ] Notice: The portion of the term of this patent subsequent to Jul. 29, 2014, has been disclaimed.

[21] Appl. No.: 724,136

[22] Filed: Sep. 30, 1996

Related U.S. Application Data

[63] Continuation-in-part of Ser. No. 261,988, Jun. 17, 1994, Pat. No. 5,651,865.

[51] Int. Cl.$^6$ .................................................. C23C 14/34
[52] U.S. Cl. .............................. 204/298.08; 204/192.12; 204/298.07; 204/298.14
[58] Field of Search ..................... 204/192.12, 192.13, 204/298.03, 298.06, 298.08, 298.07, 298.14

[56] References Cited

U.S. PATENT DOCUMENTS 5,286,360  2/1994  Szczyrbowski et al. .......... 204/298.08
5,427,669  6/1995  Drummond ........................ 204/298.08

FOREIGN PATENT DOCUMENTS

0591675  4/1994  European Pat. Off. .
0636702  2/1995  European Pat. Off. .

*Primary Examiner*—Nam Nguyen
*Attorney, Agent, or Firm*—Trapani & Molldrem

[57] ABSTRACT

Pulses of a positive voltage are superimposed onto negative dc sputtering current that is applied to the target of a dc sputtering process to create a reverse bias. This charges insulating deposits on the target to the reverse bias level, so that when negative sputtering voltage is reapplied to the target, the deposits will be preferentially sputtered away. The reverse bias pulses are provided at a low duty cycle, i.e., with a pulse width of 0.25 to 3 microseconds at a pulse rage of 40 to 200 KHz. This technique reduces or eliminates the sources for arcing. A circuit arrangement for reverse biasing provides the forward (negative) dc sputtering power as a current source, and provides the pulses of reverse (positive) voltage as a voltage source.

5 Claims, 4 Drawing Sheets

FIG.1

PASCHEN CURVE

PREFERENTIAL SPUTTERING OF INSULATORS FROM CONDUCTIVE TARGETS

CROSS-REFERENCE TO RELATED APPLICATION

This is a continuation-in-part of my earlier patent application Ser. No. 08/261,988, filed Jun. 17, 1994, now U.S. Pat. No. 5,651,865.

BACKGROUND OF THE INVENTION

This invention relates to the deposition of thin films and is more particularly concerned with a reactive sputtering process wherein atoms of a target material are freed from a conductive target and are reacted with a reactive gas to form a coating which is deposited on a substrate. This process can be employed, for example, in creating dielectric insulating layers on electrical parts, or wear-resistant layers on mechanical parts.

The invention is more specifically directed to a dc sputtering process in which the dielectric coating material that becomes lodged on the conductive target is removed, thus avoiding a major cause of arcing.

Sputtering is a vacuum deposition process in which a sputtering target is bombarded with ions, typically an ionized noble gas, and the atoms of the target material are mechanically freed by momentum transfer. The target material then coats a nearby substrate.

In a reactive sputtering process a reactive gas is introduced into the deposition chamber, and the freed target material reacts with the reactive gas to form a coating material. For example, the target material can be aluminum, and oxygen can be introduced as the reactive gas to produce a coating of aluminum oxide. A carbonaceous gas, e.g., acetylene, can be used as the reactive gas to produce carbide coatings such as SiC, WC, etc., and ammonia can be introduced to produce a nitride coating such as TiN. In any event, the conductive target atoms and the reactive gas react in plasma in the chamber to produce the compound that serves as a coating. In a typical example, aluminum atoms freed from an aluminum target enter plasma of argon and oxygen to produce a deposition of aluminum oxide.

DC sputtering is a random process and the insulating coating material is deposited on all available surfaces. This means that not only does the insulating material coat the article in question, but it also coats other surfaces in the chamber as well, including the target. Thus, in a reactive sputtering process for depositing aluminum oxide, molecules of $Al_2O_3$ land on the surface of the aluminum target. This deposition of an insulator on the target causes severe problems, including a reduction of sputtering rate and a propensity to induce arcing.

Contamination of the target can also result, even in conventional dc sputtering, due to atmospheric gases, water droplets, inclusions, and other contaminants. Each of these can be a source for arcing, and their presence will also reduce the deposition rate over time because of a reduced active sputtering area on the target. Accordingly, these problems necessitate a frequent cleaning of the target surface.

This problem has been known to exist for some time, but its causes have not been completely appreciated. Procedures to deal with these problems, such as arc control in reactive sputtering, have not been completely satisfactory.

A standard approach involves sensing the presence of arcing, and then interrupting current flow. This will control the arcing, but does nothing about the insulating coating that continues to cover the target.

One early attempt to deal with arcing in a blind fashion involves periodically interrupting the current flow between the dc power supply and the plasma generator in which the sputtering occurs. Here, shutting off the dc power serves to extinguish early arcing. This means that unipolar pulses of power at a fixed duty cycle are fed to the target. This does have the beneficial effect of permitting charge to build up only partially across the dielectric deposition on the target, so that arcing is less likely to occur, and also can lead to a small amount of resputtering of the deposition. However, this system while slowing down the rate of insulating deposit on the target, does not reverse the deposition.

Another system previously proposed is called a low-energy small-package arc repression circuit. An example of this is described in Drummond U.S. Pat. No. 5,427,669. In that system, an electronic switch cycles at a rate of about 500 Hz to 2 KHz to cut out current to the target. This system has as its object to clean out charge build-up from the plasma. The electronic switch reverses the voltage on the target to several volts positive, and draws some electrons from the plasma to the front surface of the insulative deposition. This neutralizes the anions on the front surface of the deposition, to discharge the voltage buildup across the layer, thereby greatly reducing the occurrence of dielectric breakdowns and arcing. Also, discharge of the front surface of the insulative layer lowers the surface potential to approximately that of the target. Discharging of the dielectric deposition also permits the argon ions in the plasma to collide with the insulating dielectric material. This does result in some resputtering of the molecules of the deposited material, thus slowing down the rate of deposit on the target.

However, this approach does not resputter the molecules of the deposited compound as effectively as the atoms of the target material, and so this approach has not been effective in removing significant deposits from the target during reactive sputtering processes.

Different materials require different voltages to be applied to the targets to effect sputtering. For example, because a gold atom is a much heavier atom than an aluminum atom, it requires a much more energetic ion to free it from the target. Typically, in a process that employs an aluminum target, the applied voltage needed is about –450 volts, while in a similar process that employs a gold target the applied voltage has to be about –700 volts.

Considering that an aluminum oxide ($Al_2O_3$) molecule is significantly heavier than an aluminum atom, one can understand that a higher potential would be required to energize the argon ion enough to resputter the coating. This is, of course, true for other materials as well.

Another approach to solve this problem involves a pair of sputtering targets, with one serving as cathode and the other as the anode. An example of this technique is described in Mark U.S. Pat. No. 5,303,139, in which applied electrical voltage is periodically reversed so that the sputtering occurs first from the one target and then from the other. This process also reverses the charge on the deposited insulating material as well, which reduces the possibility of arcing and also resputters some of the insulating material on the targets. However, this arrangement, requiring plural targets, can be cumbersome and expensive to employ.

Various sputtering arrangements are also described in Published EPA 0,564,789 A1, published Oct. 13, 1991, which can employ reactive sputtering. In one proposed technique, a first switch turns a main sputtering voltage off and on, while a second switch turns a bias source on and off. At best, this technique only interrupts the main sputtering power, rather than superimpose a reverse voltage on the sputtering current. Thus, this technique is not capable of achieving high deposition rates.

These previous solutions, which employ unipolar pulsing or alternately cycled targets, have been effective in reducing voltage stress on insulating films redeposited on the targets, but have not been effective in removing the redeposit or in preventing it. None of these approaches sputters off the insulator from the beginning before it has a chance to accumulate, and none of these techniques has been effective in eliminating or halting the redeposition of insulating film on the target.

OBJECTS AND SUMMARY OF THE INVENTION

It is an object of this invention to enhance reactive sputtering in a fashion which avoids accumulations of insulating deposition on the conductive target.

It is another object to carry out reactive sputtering under conditions that eliminate sources of arcing and which maximize the rate at which sputtering can take place.

According to an aspect of the present invention, a reactive dc sputtering process is carried out in a plasma chamber by applying an electric potential to a conductive target so that target material is sputtered from the target and is reacted with a reactive gas that is introduced into the chamber. A dc sputtering current is furnished from a power supply to the sputtering target, which serves a cathode, with a conductive surface in the plasma chamber being held at ground to serve as anode. This current is at a suitable applied voltage, e.g., −500 volts, so that a noble gas, e.g., argon, present in the chamber is ionized and creates plasma, e.g., argon anions and free electrons. The electrons are drawn of in the anode, and the positive argon ions are accelerated toward the cathode, that is, toward the conductive target. The argon ions knock atoms of the target material free from the target by momentum transfer. The argon ions pick up electrons from the negatively charged target, and migrate back to the plasma. The freed target atoms enter the plasma and react with a reactive gas that has been introduced into the chamber. The reactive gas can be, for example, oxygen, borane, acetylene, ammonia, silane, arsene, or various other gases. The reaction product is deposited on a substrate positioned adjacent the plasma. The substrate can be a masked semiconductor wafer on which a compound such as $Al_2O_3$, $SiO_2$, or another insulator or dielectric is to be deposited. In some processes, the substrate can be a drill bit, wear plate, valve spindle, or other mechanical part on which a wear resistant coating, such as WC or TiN, is deposited.

As mentioned before, the reaction product of the reactive sputtering process is deposited randomly, and not only coats the workpiece substrate, but also coats other surfaces including walls of the chamber and the sputtering target. Accumulation of the insulating coating can induce arcing, and also reduces the available area of the sputtering target, thereby reducing the sputtering rate over time.

In this invention, the negative dc sputtering current that is applied at a negative forward voltage to the target has superimposed upon it reverse-bias pulses of a positive dc voltage relative to the anode. Preferably, the reverse bias pulses are at a level of 50 to 300 volts above ground potential, preferably 50 to 150 volts, and these are applied at a pulse frequency of 40 KHz to 100 KHz (or higher in some cases) with a pulse width of 0.25 μsec to 3 μsec. This results in low duty cycle pulses (about 10%). The duty cycle should be significantly below 50%. The reverse bias creates a reversal of the charge across the insulating material. These accumulations behave as a capacitor, with the conductive target being one plate and the conductive plasma being the other plate. The reverse voltage is applied long enough (e.g., 2 μsec) for the polarity of the capacitive charge to be reversed, up to −300 volts, on the plasma side of the deposition.

Then when the normal or negative sputtering voltage is again applied, the argon ions in the plasma are accelerated preferably toward the reverse-charged dielectric material. These ions are accelerated to an increased energy due to the additional potential difference. As a result, the molecules of the deposition are re-sputtered off the target. This process keeps the target clear of depositions, and thereby eliminates the main sources of arcing. This process also permits the active sputtering surface of the target to remain as large as possible.

This process also cleans out other insulative contaminants from the surface of the target whether used for reactive sputtering or conventional sputtering.

The technique of this invention produces asymmetric bipolar pulsed dc sputtering, and can be referred to as preferential sputtering. Preferential sputtering eliminates unwanted dielectric coating from the face of the target, and thus avoids the major cause of arcing. With this technique, arcing is actually prevented, so the additional circuitry of the patents mentioned above, to wit, for detecting and killing the arc, is not needed. This technique thus makes a marked departure from the prior art, which does not address the root cause of the problem, namely target poisoning.

The circuitry which carries out the technique of this invention permits the negative or forward sputtering power source to behave as a current source, while the positive or reverse bias source behaves as a voltage source. In this way, the reverse bias voltage pulses create regions of higher negative charge on the target where there are deposits of dielectric material, so that the argon ions in the plasma will, by preference, strike this material and remove it from the target. On the other hand, the frequency, duty cycle and reverse bias voltage level are kept at appropriate levels so as to avoid or minimize reverse or back sputtering. Because the main sputtering power continues as from a current source, current flow in the plasma resumes immediately after each reverse bias pulses. Thus this technique does not impair the normal sputtering, which may take place in the "superglow" region.

The reverse bias pulse rate, being in a preferred range of about 40 KHz to 100 KHz for most reactive sputtering processes, e.g., aluminum oxide, and up to 250 KHz for other sputtering processes, is consistent with the reverse bias supply acting as a voltage source and does not interfere with the main sputtering supply which acts as a current source. This again maximizes forward (negative) sputtering current flow, with the reverse bias voltage effectively serving the function, as described above, of eliminating dielectric material and other impurities from the target surface.

The above and many other objects, features, and advantages of this invention will become more apparent from the ensuing description of a preferred embodiment, which should be read in conjunction with the accompanying Drawing.

DETAILED DESCRIPTION OF THE PREFERRED EMBODIMENT

Figure 1:
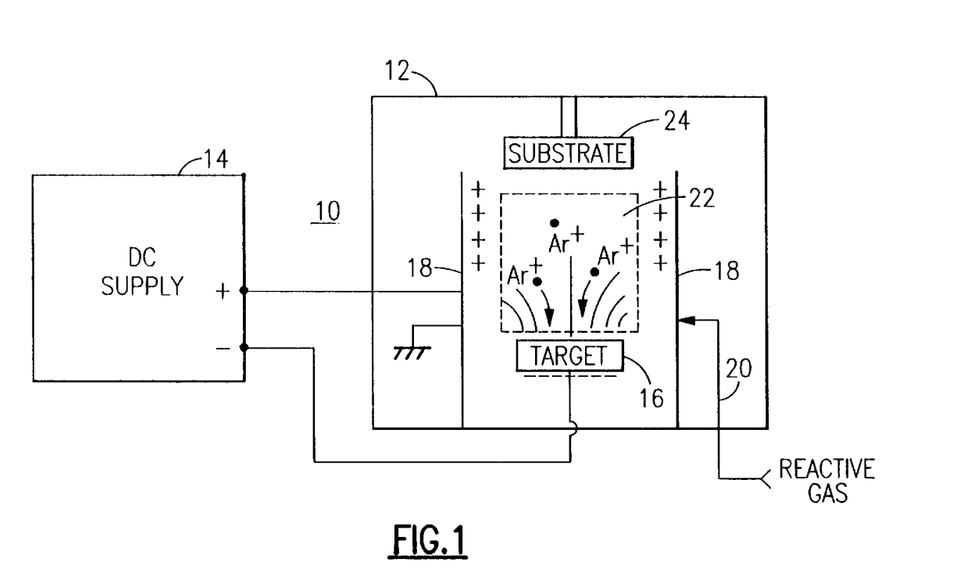
FIG. 1 is a schematic view of a dc sputtering arrangement for explaining the principles of reactive dc sputtering.

With reference to the Drawing and initially to FIG. 1, a dc sputtering arrangement 10 employs a plasma chamber 12 and a regulated dc power supply 14. The plasma chamber 12 is evacuated by a vacuum pump (not shown) and is supplied with a controlled amount of a noble gas, typically argon.

The positive ions $Ar^+$ are accelerated by the steady-state field towards the target 16 or cathode, where they recombine with electrons in the target. To achieve a sputtering effect, the ions are made energetic enough so that their kinetic energy will knock atoms of the target material off the target 16 when the ions collide with it. The freed target atoms then enter the plasma and react with the reactive gas that is introduced into the chamber. The product of this reaction deposits itself on any available surface, and preferably on the substrate 24. The reaction product also redeposits on the target 16, as well as other surfaces in the plasma chamber. Accumulations of insulating deposit on the target can lead to arcing and other problems.

Control of the sputtering process requires control of voltage, current flow, and current density.

Current flow is required for sputtering, and all else being equal, higher current produces proportionately more collisions of the $Ar^+$ ions onto the target. Therefore, a high deposition rate requires higher current flow.

Different target materials require different levels of applied voltage. For example, a gold atom is significantly heavier than an aluminum atom, and therefore requires a much more energetic ion to knock it free from the target. In a typical dc sputtering process that can use either a gold target or an aluminum target, a voltage of about −450 volts is required for aluminum, whereas a much higher −700 volts are required for gold. There is thus a lower limit at which plasma exists, but where no sputtering takes place because the ions are not sufficiently energetic. Each process will have a lower limit on sputtering voltage depending on the target material.

Current density is an important factor and has to be controlled. In the sputtering process it is desirable to maximize the deposition rate but it is also imperative to avoid arc discharges.

The upper limit of deposition rate occurs when the current density of the plasma is in a so-called superglow region. This can be explained with reference to FIG. 2, which shows the relation of current density in plasma to the voltage drop across the plasma. This curve is the so-called Paschen curve.

Figure 2:
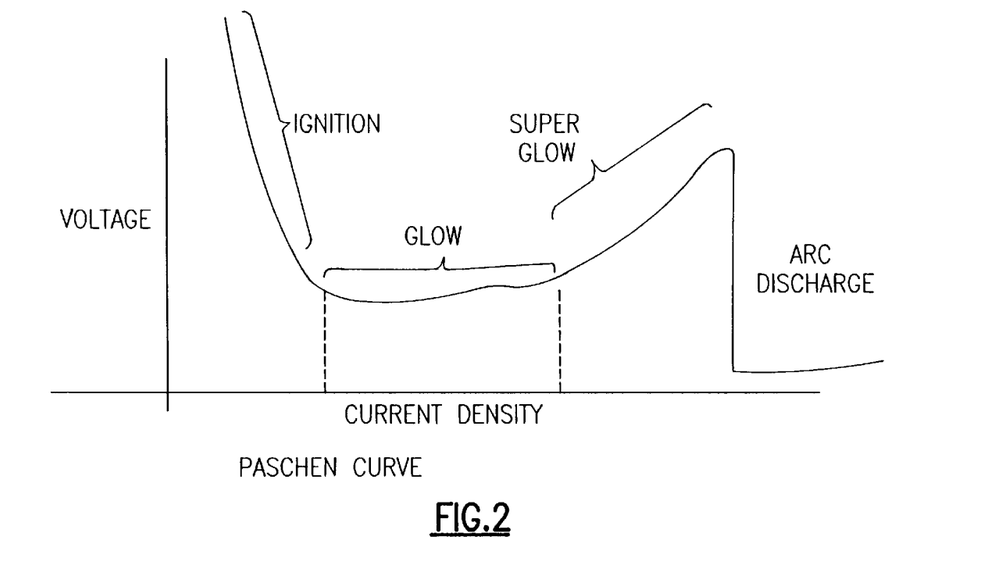
FIG. 2 is a Paschen curve of voltage versus current density, showing the various regions of plasma behavior in a sputtering operation.

In an initial region shown at the extreme left side of FIG. 2, before the plasma is ignited there is a zero current density and the entire voltage necessary for ignition appears across the gaseous medium. For low current densities, there is a negative-resistance region indicated as the ignition region, where the voltage across the plasma drops with increased current density, until a generally flat region, i.e., a "glow" region, is reached. As current density increases, a "superglow" region is reached. Here the plasma becomes more energetic and thus more resistive to the movement of argon ions across it; hence the voltage increases across the plasma. Beyond this region the current density becomes so high that the plasma self-heats the ions to the point that the plasma generates thermal electrons and photons which then cause runaway ionization. This drastically increases the number of ions, i.e., the number of charge carriers in the plasma. The plasma impedance drops, and current flow increases. This produces a sharp negative resistance region leading to an arcing region where the impedance is very small and current is limited only by the output impedance of the power source. The arcing that is produced here creates deleterious effects on the target, such as pitting, flaking and cracking, as well as localities of extreme heat. Moreover, as soon as arcing occurs, sputtering stops.

Therefore, in a sputtering process, a number of factors come into play: deposition rates are directly related to current flow; applied voltages are determined by the characteristics of target materials; and arc discharging directly follows from excess current density conditions.

Figure 3:
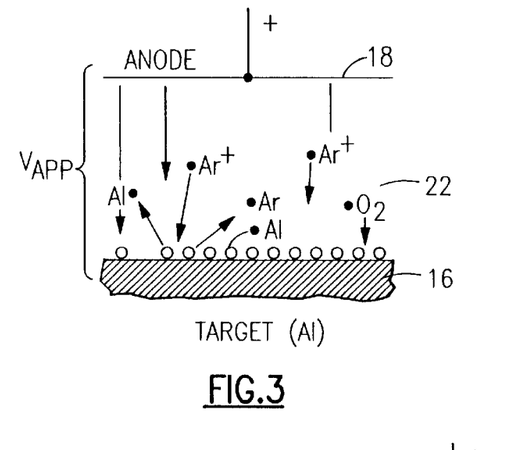
FIGS. 3 to 5 are schematic views for explaining the adverse effects of film accumulations on the sputtering target.

The problems that arise from redeposition of insulator reaction products onto the target 16 can be explained with reference to FIGS. 3, 4, and 5. As shown in FIG. 3, the potential difference between the positive anode 18 and the negative target 16 produces electric field lines from the anode to the target. Sputtering power, at an applied voltage $V_{APP}$, typically on the order of about 300 to 500 volts dc, is furnished from the dc power supply 14 to the anode 18 and target 16. In this example, the target is made of aluminum, the plasma 22 is formed of argon ions $Ar^+$, and oxygen $O_2$ is introduced as a reactive gas. Initially, the electric field lines are distributed more or less uniformly over the surface of the target, so that the argon ions bombard the target 16 over its entire surface. Wherever the argon ion impacts, aluminum atoms are knocked free by momentum transfer. The argon ions pick up electrons from the negative target 16, and electrons in the plasma are absorbed into the anode 18.

The freed aluminum atoms enter the plasma 22 and react with oxygen in the plasma, forming alumina $Al_2O_3$. The alumina molecule is neutral and non-conducting, and deposits itself on any convenient surface which it contacts. Some of the alumina lands on the target 16 and produces as a deposition an insulating layer 26, as shown in FIG. 4.

Figure 4:
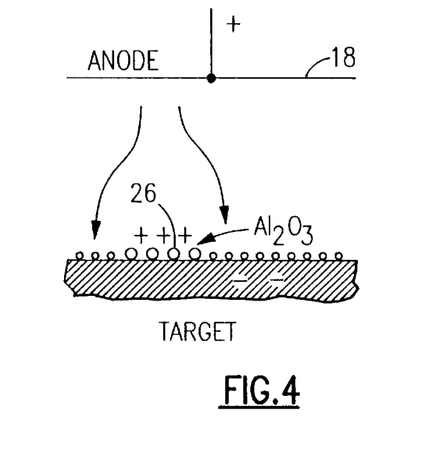
Figure 5:
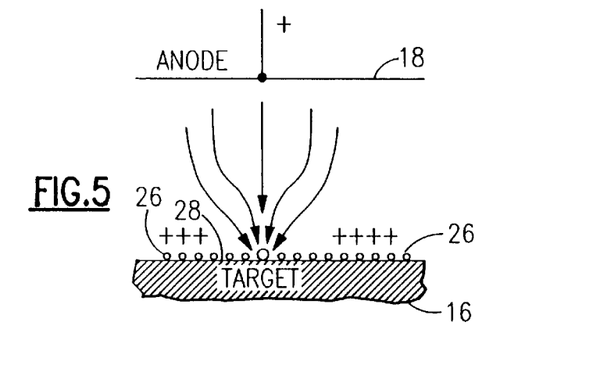

Because the insulating deposition 26 is a dielectric, i.e., an insulator, and the plasma 22 itself is a conductor, the surface that faces the plasma, that is the upper surface in FIG. 4, accumulates a positive change. This deflects the electric field lines around the deposition 26. The ions tend to follow the field lines and thus are accelerated toward the uncoated aluminum areas of the target. The argon ions collide with and sputter aluminum, but do not resputter the $Al_2O_3$ material. Consequently, the alumina continues to coat the exposed surface of the target, while the relative area of aluminum metal, that is still available for sputtering, diminishes. The result is to increase the current density while reducing the overall current flow, thus reducing the deposition rate. Eventually nearly the entire surface of the target 16 becomes coated, so only a small area of the target remains uncovered and available for sputtering. This causes the electric field lines to converge on localized spots as shown in FIG. 5. Ions impact these spots at a high current density, leading to arc discharge.

Figure 6:
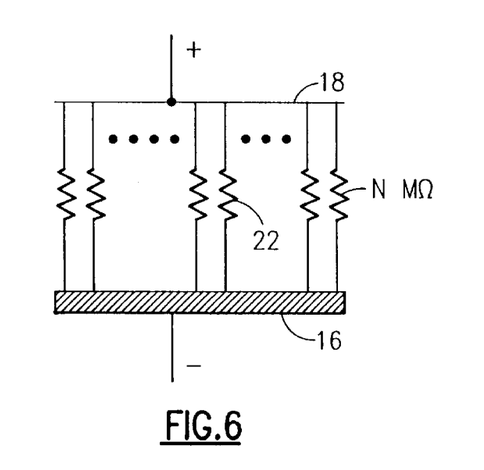
FIGS. 6 and 7 are schematic representations of an ideal sputtering process and one in which an arc discharge condition occurs.
Figure 7:
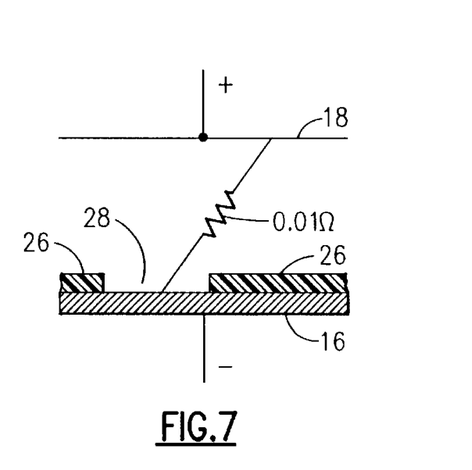

The adverse effects of insulative redeposits on the target can be explained with reference to FIGS. 7 and 8. Under glow or superglow conditions, the plasma 22 can be considered to function as thousands of high-value resistances connected in parallel, with leads positioned uniformly over the face of the target 16. In other words, the plasma can be considered as several thousand-megohm resistors as shown in FIG. 6. As the coating of insulating material develops on the target, the available are on the target is diminished, ultimately to small uncoated gaps 28. The current density at the gaps 28 enters the negative resistance zone of the Paschen curve (FIG. 2) and the current path becomes restricted. The effective resistance drops to a very small value, e.g., 0.01 ohms, as illustrated in FIG. 7. Under these conditions arcing occurs.

The above-described problem comes about because the insulating film 26 forms a dielectric, sandwiched between the electrodes formed by the conductive plasma 22 and the conductive target 16, respectively. The top surface, i.e., the plasma side of the insulating film 26, charges up to the applied voltage $+V_{APP}$ because of charge received from the positively charged argon ions.

Because of electrostatic repulsion between the positively charged ions, the argon ions Ar+ are steered away from the film-coated areas of the target toward the remaining uncoated metal areas. This raises the current density on those areas. Therefore the total current flow has to be reduced to keep the current density within the superglow range and this of course reduces the deposition rate. Also, because the argon ions are steered away from the coated areas of the target 16, there is little resputtering of the insulating film 26. Consequently, the redeposition of the insulating film continues unabated, until the sputtering process has to be terminated.

The zone of insulating film can be considered a capacitor to which a dc voltage is applied. The insulating film 26 on the target 16 charges up to the applied voltage $V_{APP}$. When the capacitor is charged, no further current can flow, i.e., the area covered by the insulating film is unavailable for sputtering. Plasma current is directed to the remaining uncovered gaps 28 on the target. Eventually, the current density will creep up to the arc discharge region of the Paschen curve (FIG. 2) which establishes a limit for reactive dc sputtering.

Another problem that can arise from the accumulation of the dielectric layer 26 is that the dielectric layer may not be strong enough to tolerate the entire applied voltage $V_{APP}$. In that case, the dielectric layer will punch through and fail. When this happens, the failure region will be flooded with charge, causing a radical increase in local conductance, and a consequent increase in local current density. This can produce local arcing, and can bring the entire plasma 22 to an arc discharge condition.

Returning to the Paschen curve of FIG. 2, in the glow and superglow regions the plasma 22 has a positive resistance and exhibits stable behavior. The arc discharge region is entered whenever the current density, even for a local area, exceeds the superglow limit. The arc discharge behaves like a short from anode to target, and exhibits a negative resistance so the more that current flows, the lower the resistance becomes. To stop the arc discharge, the current density in the plasma has to drop to the point where it crosses back to the glow or superglow regions.

The most reliable approach, to date, has been to remove all current flow as quickly as possible. However, when the current flow resumes, there is nothing to prevent the arc conditions from recurring.

Modern power supplies for dc sputtering often incorporate arc detecting circuitry which shuts the current off when an arc is detected. The current must remain off long enough for the arc current to decay. This can reduce effective net power to the plasma chamber 12.

One attempt to deal with this problem of arc prevention has been the introduction of unipolar pulsing. This technique involves shutting off the power supply, creating pulses at a fixed rate and duty cycle. This produces alternate application or negative and ground voltage to the target, which allows the positively charged dielectric material of the layer 26 to be partly charged, and then partly discharged around a bias point. This reduces the voltage stress on the insulating layer, and does permit some re-sputtering of the insulating layer.

Figure 8A:
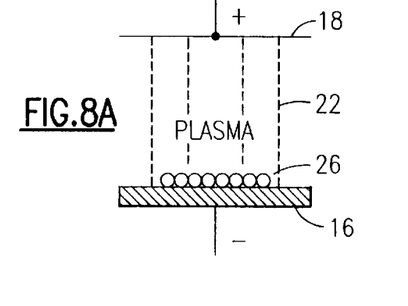
FIGS. 8A and 8B are schematic views illustrating equivalency of an insulative film accumulation on the sputtering target with a capacitor.
Figure 8B:
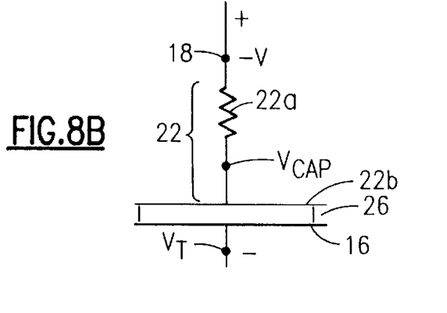
Figure 9:
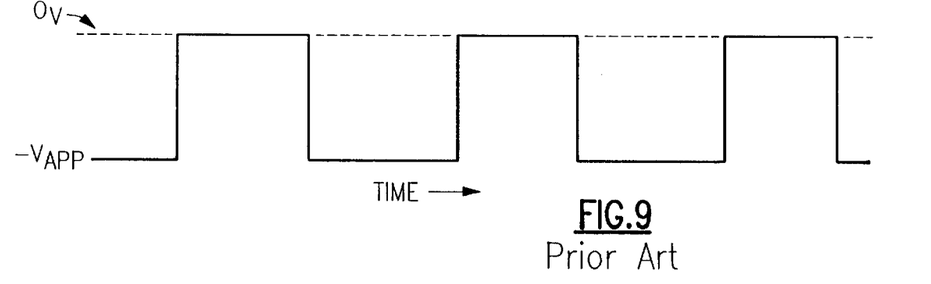
FIG. 9 is a chart showing a pulse waveform for unipolar dc sputtering according to the prior art.

This system can be understood with reference to FIGS. 8A, 8B, and 9. As shown in FIGS. 8A and 8B, the plasma chamber can be considered as a capacitor circuit in which the target 16 serves as one electrode or plate, the deposition of insulating material 26 serves as the capacitor's dielectric layer, and the plasma 22 serves as a series resistance 22a and also as the other (positive) electrode or plate 22b of the capacitor. The voltage applied to the target $V_T$ can be a pulsed dc voltage alternating between the applied potential $V_{APP}$ and ground potential, i.e., zero volts. The anode 18 is considered to be at ground potential. In this prior-art unipolar pulsed power system, the upper plate 22b of the capacitor, i.e., the dielectric layer 26 is permitted to decay back toward target potential. In FIG. 8B, the voltage at the upper capacitor plate is represented as $V_{CAP}$. Typically, the applied voltage is interrupted for periods of 10 microseconds or more with a pulse rate below 2 kilohertz, i.e., a pulse period of 500 microseconds or longer. This technique is intended to prevent a high-voltage build-up on the dielectric or insulating layer 26, but does not actually remove the positive charges. Consequently, even though some resputtering of the layer may occur from ion bombardment, the net effect is simply to slow the rate at which the insulting later accumulates on the target.

The technique of this invention can be explained with reference to FIGS. 10 and 11. In this technique, pulses 30 of reverse bias voltage $+V_{REV}$ are inserted onto the negative dc sputtering voltage $-V_{APP}$. The effect of this is to bring the target voltage $V_T$ above ground potential to the reverse bias voltage $+V_{REV}$. This lifts the capacitor voltage $V_{CAP}$, i.e., the potential of the upper surface of the dielectric layer 26 to a high potential so that the layer 26 absorbs free electrons from the plasma 22 until it achieves ground potential, i.e., corresponding to the potential of anode 18. This decay is shown at curves 32 in FIG. 11.

Figure 10:
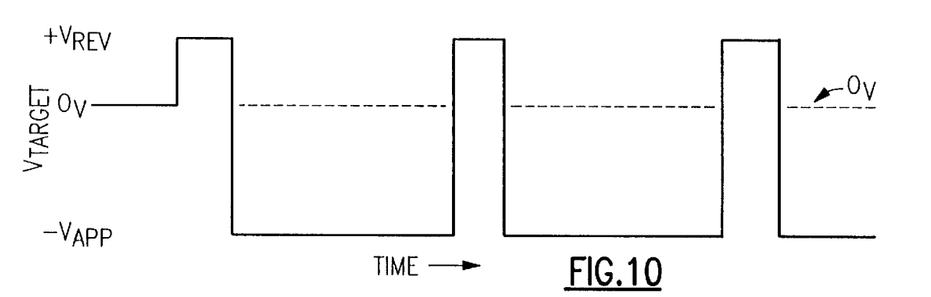
FIG. 10 is a chart showing a pulse waveform for low duty cycle reverse bias dc sputtering, according to this invention.
Figure 11:
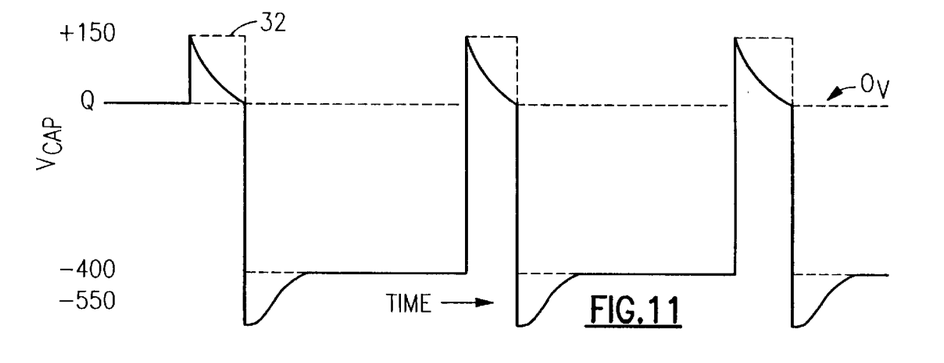
FIG. 11 is a waveform chart showing the behavior of electric potential at the plasma-facing surface of an insulator film accumulation on the conductive target, according to an embodiment of this invention.

As illustrated in FIG. 10, the reverse bias pulses create asymmetric bipolar pulsed dc. The positive reverse voltage has smaller excursions than the negative sputtering applied voltage, and the reverse pulses have a small duty cycle (e.g., 10%), that is, the pulse width is small relative to its period.

Then the sputtering current, at the applied negative voltage, is resumed at the end of the pulse. This brings the lower electrode of the capacitor, i.e., the target 16 to the negative forward voltage $-V_{APP}$.

The upper, or plasma-facing surface of the dielectric deposition layer 26 is then brought to a very negative potential, more negative than the target potential by the amount $-V_{REV}$.

For a practical example of a reactive sputtering system, e.g., Al to produce $Al_2O_3$, the applied voltage $V_{APP}$ can be −400 V dc, and the reverse bias voltage can be +150 volts. In this case, the voltage $V_{CAP}$ which appears on the upper surface of the layer 26 follows the voltage waveform of FIG. 11. At the onset of application of −400 volts to the target 16, the dielectric voltage drops to −550 volts. This is more negative than the target potential, and tends to attract the positively charged argon ions towards the accumulations of $Al_2O_3$. These ions are more energetic than those that strike the uncoated target. These more energetic ions are able to free the relatively heavy oxide molecules from the insulating layer 26, and these molecules deposit themselves elsewhere. Thus, the reverse bias pulses serve to clean the target of the insulating deposition, so that sputtering can continue unabated until the target is consumed.

The reverse bias pulses are also effective in removing impurities and inclusions from the target 16. This technique can also be employed to prepare or "condition" an aluminum target which has been exposed to the atmosphere. In a standard aluminum reactive sputtering technique, a separate conditioning phase is required, and this can damage the aluminum target due to pitting and stressing. This preconditioning stress damage can actually produce arcing during a subsequent sputtering process. On the other hand, the reverse bias pulsing technique of this invention sputters off oxides and impurities with little or no damage to the target and without arcing.

A principal benefit of this technique is that it removes sources for arcing, rather than simply interrupting or limiting arcing. This technique permits a reactive sputtering operation to run as close as possible to the high end of the superglow region, which maximizes deposition rates without risk of encountering arc discharge conditions.

In a preferred mode, the reverse bias pulse can be provided at 150 volts, at period of 2 μsec and a pulse repetition rate of 50 KHz. The duty cycle should be kept small so that sputtering is not unduly interrupted. The pulse period should be of sufficient length to allow the dielectric layer to be reverse biased, and this period can be between 0.25 μsec and 3 μsec. The pulse repetition rate can be between 4 KHz and 200 KHz, and in some cases above 200 KHz. For many common coating applications, the reverse bias voltage can be +150 volts, the pulse rate about 100 KHz and the pulse width about 2.5 to 3 μsec. The positive reverse bias voltage is tailored to the particular sputtering operation, as is the negative applied voltage. That is the applied voltage $V_{APP}$ can be between −300 and −700 volts, and the reverse bias voltage can be between +50 and +150 volts. Under some conditions, the reverse bias voltage can be higher, up to +300 volts.

Figure 12:
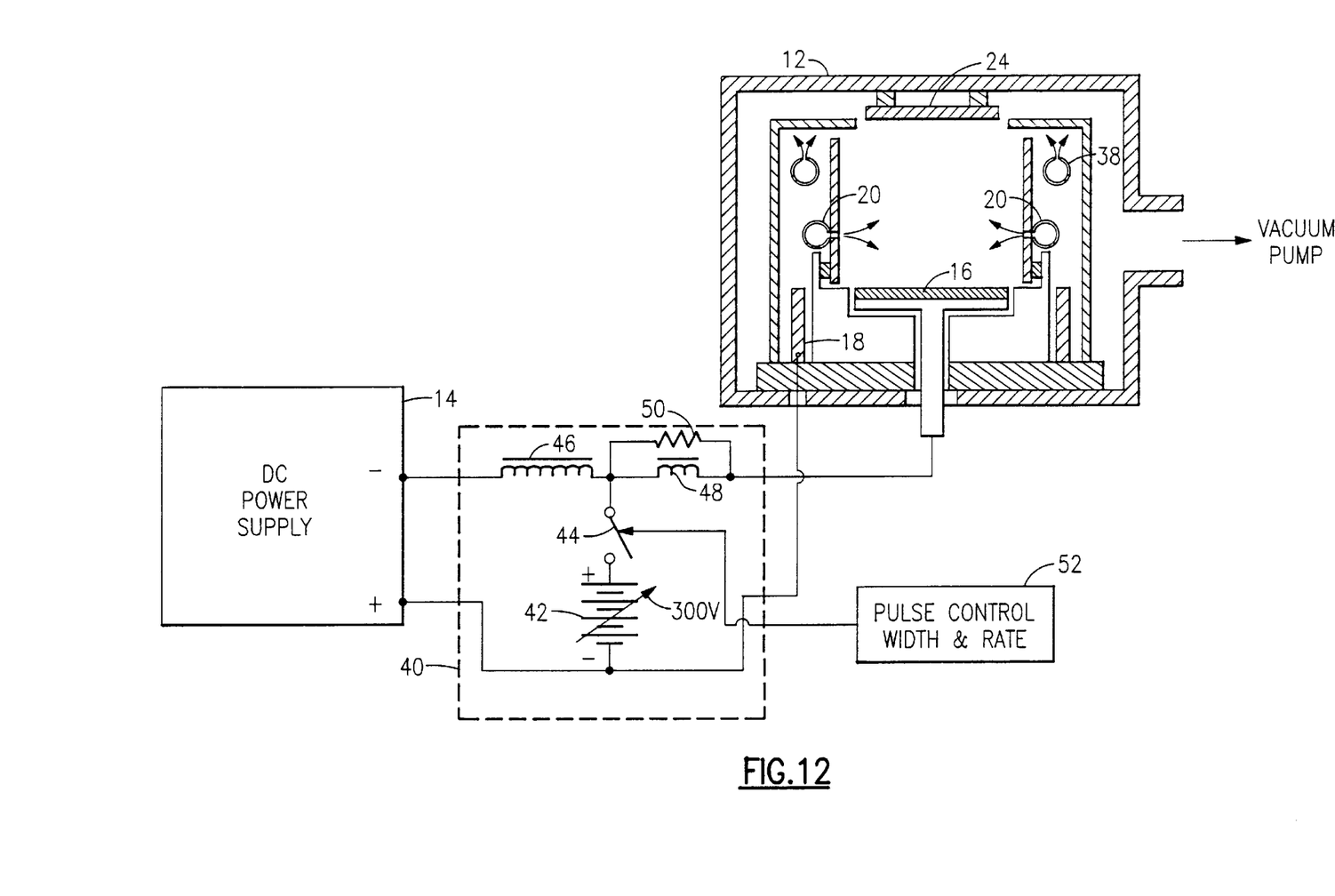
FIG. 12 is a schematic view of an arrangement for practicing reactive dc sputtering according to the principles of this invention.

A practical embodiment of a reactive dc sputtering arrangement, with a reverse bias pulsing feature of this invention, is shown in FIG. 12. Here the chamber 12 has the target 16 coupled to a negative terminal of the power supply 14 and its anode 18 coupled to the positive terminal of the power supply 14. The substrate 24 is situated within the plasma chamber; argon or another suitable sputtering gas is introduced through a gas conduit 38, while the reactive gas, e.g., oxygen is delivered through a reactive gas conduit 20. The chamber is continuously evacuated by a vacuum pump (not shown).

A reverse-bias pulse arrangement 40 is installed between the dc power supply 14 and the plasma chamber 12. This arrangement includes a dc voltage source 42 that is connected in series with a controlled switch 44 to supply the reverse bias voltage. The voltage source 42 can be a switch mode power supply that is variable up to 300 volts. A large inductance 46 is coupled between the negative terminal of the power supply 14 and a terminal of the switch. A smaller of inductance 48 and a parallel resistor 50 are coupled between that terminal of the switch 44 and the cathode or target 16. The large inductance serves as current steadying means to keep a constant current flow from the main power supply 14. The small inductance 48 and the resistor 50 act as a snubber circuit to suppress any spikes from the reverse bias voltage source 42. The inductances 46 and 48 are in series in one current path between the negative terminal of the supply 14 and the target 16, while the other side of the dc voltage source 42 is in another current path between the positive terminal of the supply 14 and the anode 18.

A pulse-width and a pulse-rate control circuit 52 generates signals that actuate the switch 44 to create the reverse bias pulses of suitable duty cycle and pulse frequency. The switch closure times are controllable by the control circuit 52, and the output voltage of the power supply 42 is also controllable, e.g., from 50 volts up to 300 volts. The duty cycle and pulse repetition rate, or alternatively the pulse width and pulse repetition rate, can be continuously variable within their ranges. These can be operator controlled, or can be controlled automatically.

When the switch 44 closes, the reverse bias voltage source 42 applies a positive bias voltage to the target 16 and applies a negative voltage to the anode 18. Then when the switch 44 opens, the voltage source 42 is cut out, and the forward sputtering current resumes. The potential at the target reverts to the negative applied voltage $V_{APP}$ from the power supply 14.

The elements including the reverse bias pulse arrangement 40 and the pulse-rate and pulse-width control circuit 52 can be made as a compact, self-contained unit that can be coupled between a standard power supply 14 and a standard plasma chamber 12. This permits the advantages of this invention to be added to an existing sputtering power supply or plasma generator.

While lower pulse rates for the reverse bias pulses will produce greater deposition rates, under some circumstances, higher pulse rates are appropriate. This depends on the particular process chemistry being employed. For example, $Al_2O_3$ can be deposited with very crude gas control as long as the pulse rate is kept above 100 KHz. Also, some conductive film depositions are significantly enhanced by the use of high-frequency pulsing (above 200 KHz).

While this invention has been described with reference to a preferred embodiment, it should be appreciated that a wide variety of embodiments would present themselves to those persons skilled in the art without departing from the principles of this invention, as defined in the appended claims.

I claim:

1. Asymmetric bipolar dc plasma arrangement for a reactive dc sputtering operation wherein a target material is reacted with a reactive gas to form a compound that is deposited on a substrate, comprising:

a dc plasma chamber housing a sputtering target formed of said target material and serving as a cathode, an anode formed in said chamber, and means for introducing said reactive gas into said chamber;

a main dc sputtering power source configured as a current supply providing to said target continuous dc sputtering power at a predetermined negative voltage level that causes noble gas ions in said chamber to impinge upon said target with sufficient energy to free atoms of said target material from said target such that the free atoms react with said reactive gas to form said compound; and a switched reverse bias supply configured as a voltage supply and interposed in circuit between said main dc sputtering power source and said plasma chamber including means serving as a forward current steadying means for passing said negative sputtering power continuously to said target at said predetermined level relative to said anode, and means for superimposing, onto said continuous dc sputtering power, pulses of a positive reverse bias voltage relative to said anode at a pulse rate and pulse width so that said noble gas ions preferentially bombard accumulations of said compound which have been deposited on said target with sufficient energy to free molecules of said compound from said target, including selectable voltage adjusting means for selecting the level of said reverse bias voltage over a range; said positive reverse voltage being of smaller magnitude than said predetermined negative voltage, and said pulse width being small compared to the period thereof.

2. Asymmetric bipolar dc plasma arrangement according to claim 1 wherein said reverse bias voltage is low enough not to produce sputtering of said anode, and said pulse width is small enough to maximize forward current flow from said main power source through said plasma.

3. Asymmetric bipolar dc plasma arrangement for a reactive dc sputtering operation wherein a target material is reacted with a reactive gas to form a compound that is deposited on a substrate, comprising:

a dc plasma chamber housing a sputtering target formed of said target material and serving as a cathode, an anode formed in said chamber, and means for introducing said reactive gas into said chamber;

a main dc sputtering power source configured as a current supply providing to said target sputtering power at a predetermined negative voltage level that causes noble gas ions in said chamber to impinge upon said target with sufficient energy to free atoms of said target material from said target such that the free atoms react with said reactive gas to form said compound; and a switched reverse bias supply configured as a voltage supply and interposed in circuit between said main dc sputtering power source and said plasma chamber including means serving as a forward current steadying means for passing said negative sputtering power to said target at said predetermined level relative to said anode, and means for superimposing, onto said dc sputtering power, pulses of a positive reverse bias voltage relative to said anode at a pulse rate and pulse width so that said noble gas ions preferentially bombard accumulations of said compound which have been deposited on said target with sufficient energy to free molecules of said compound from said target; said positive reverse voltage being of significantly smaller magnitude than said predetermined negative voltage level, and said pulse width being small compared to the period thereof;

wherein said switched reverse bias supply has a first current path passing to said anode and a second current path passing to said target; said current steadying means includes an inductance in one of said first and second current paths for maintaining a constant current through said one current path; and said switched reverse bias supply includes a series circuit of a controlled switch and a voltage supply connected between the other of said current paths and a connection point in said one current path between said inductance and said plasma generator; and pulse rate and width control means coupled to said controlled switch to control the rate and duration of switching of said controlled switch, such that during said pulses of positive reverse bias voltage the switched bias supply operates as a voltage source and between said pulses said positive switched bias supply supplies said sputtering power as a current source.

4. Asymmetric bipolar dc plasma arrangement according to claim 3, wherein said means for selecting includes adjustable means associated with said voltage supply for selecting the voltage thereof between 50 and 150 volts.

5. Asymmetric bipolar dc plasma arrangement according to claim 3, wherein said one current path further includes snubber means between said connection point and said plasma generator for suppressing voltage excursions at leading and trailing edges of the pulses of reverse bias voltage.

* * * * *